US012614830B2

(12) United States Patent
    Park et al.

(10) Patent No.: US 12,614,830 B2
(45) Date of Patent: Apr. 28, 2026

(54) WAVEGUIDE COMPRISED OF STACKED LOWER AND UPPER PLATES, WHERE THE LOWER PLATE IS MOUNTED ON A CIRCUIT BOARD AND HAS A VIA THEREIN FOR ACCOMMODATING A LAUNCHER IN THE VIA

(71) Applicant: AMOSENSE CO., LTD., Cheonan-si (KR)

(72) Inventors: Hyunjoo Park, Cheonan-si (KR); Hyungil Baek, Cheonan-si (KR); Seho Lee, Cheonan-si (KR); Yunsik Seo, Cheonan-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 255 days.

(21) Appl. No.: 18/034,697

(22) PCT Filed: Oct. 27, 2021

(86) PCT No.: PCT/KR2021/015155
§ 371 (c)(1),
(2) Date: Apr. 29, 2023

(87) PCT Pub. No.: WO2022/092787
PCT Pub. Date: May 5, 2022

(65) Prior Publication Data
US 2023/0402730 A1      Dec. 14, 2023

(30) Foreign Application Priority Data
Oct. 30, 2020    (KR) ........................ 10-2020-0143703

(51) Int. Cl.
H01P 5/107 (2006.01)
H01P 3/12 (2006.01)
H05K 1/02 (2006.01)

(52) U.S. Cl.
CPC ................ H01P 5/107 (2013.01); H01P 3/12 (2013.01); H01P 3/121 (2013.01); H05K 1/0237 (2013.01)

(58) Field of Classification Search
CPC ............. H01P 3/12; H01P 3/121; H01P 5/107
(Continued)

(56) References Cited

U.S. PATENT DOCUMENTS 5,929,728 A * 7/1999 Barnett et al. .......... H01P 3/121
                                                    333/248
6,011,453 A * 1/2000 Glinder et al. ......... H01P 11/00
                                                    333/248
(Continued)

FOREIGN PATENT DOCUMENTS

JP          4634837 B2      2/2011
JP          5093137 B2      12/2012
JP          5198327 B2      5/2013

*Primary Examiner* — Benny T Lee
(74) *Attorney, Agent, or Firm* — Maschoff Brennan

(57) ABSTRACT

Disclosed is a waveguide having a first vertical transfer path formed at a lower plate coupled to a signal processing substrate, and having a horizontal transfer path and a second vertical transfer that are formed at an upper plate coupled to a radar antenna, and thus minimizing tolerance during assembly. The disclosed waveguide is constructed by stacking the upper plate on the upper surface of the lower plate, a first vertical through-hole is formed in the lower plate, a second vertical through-hole and a horizontal groove are formed in the upper plate, and the horizontal groove connects the first vertical through-hole and the second vertical through-hole to form a radio wave transfer path.

5 Claims, 4 Drawing Sheets

(58) Field of Classification Search
USPC ................................................... 333/239, 26
See application file for complete search history.

(56) References Cited

U.S. PATENT DOCUMENTS

| 7,336,221 | B2 | 2/2008 | Matsuo et al. | |
| 7,680,464 | B2 * | 3/2010 | Pleva et al. ............. | H01P 5/107 |
| | | | | 455/328 |
| 8,054,142 | B2 * | 11/2011 | Fujita ...................... | H01P 3/121 |
| | | | | 333/137 |
| 2004/0227597 | A1 * | 11/2004 | Chang et al. ........... | H01P 1/022 |
| | | | | 333/254 |
| 2009/0224857 | A1 | 9/2009 | Fujita | |

* cited by examiner

[FIG. 1]
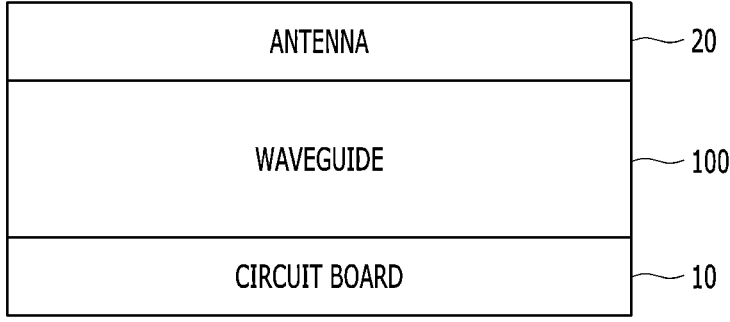
[FIG. 2]
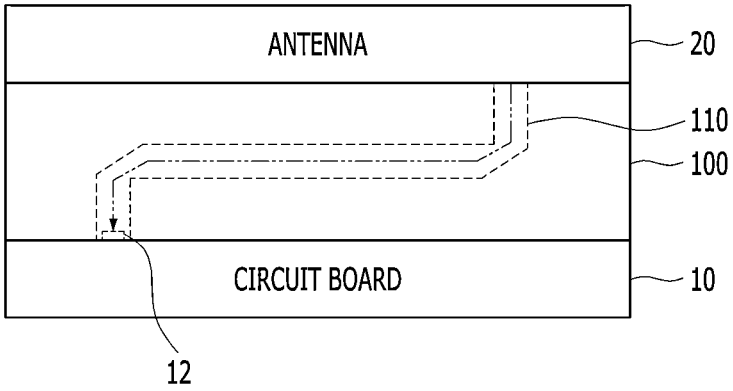
[FIG. 3]
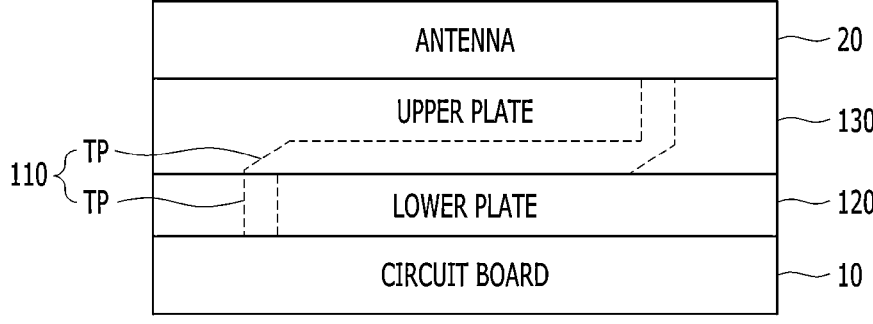

[FIG. 4]
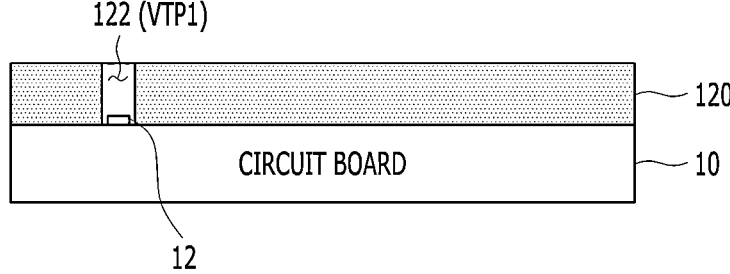
[FIG. 5]
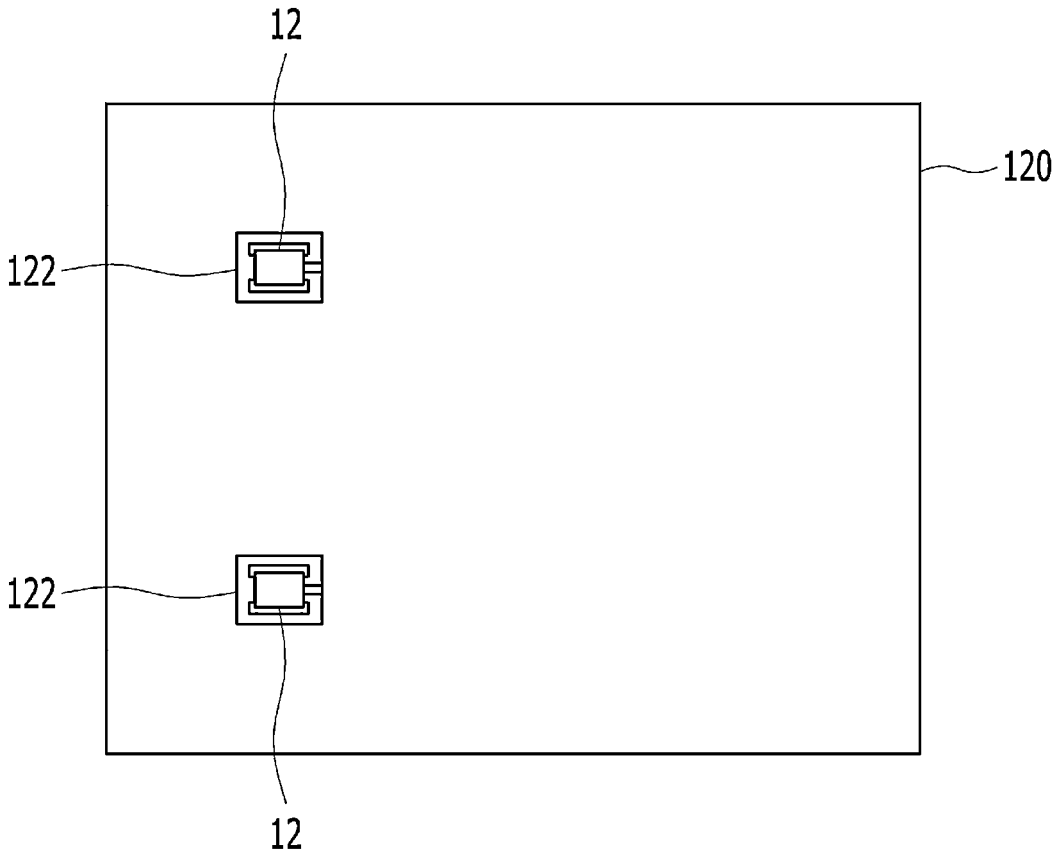

[FIG. 6]
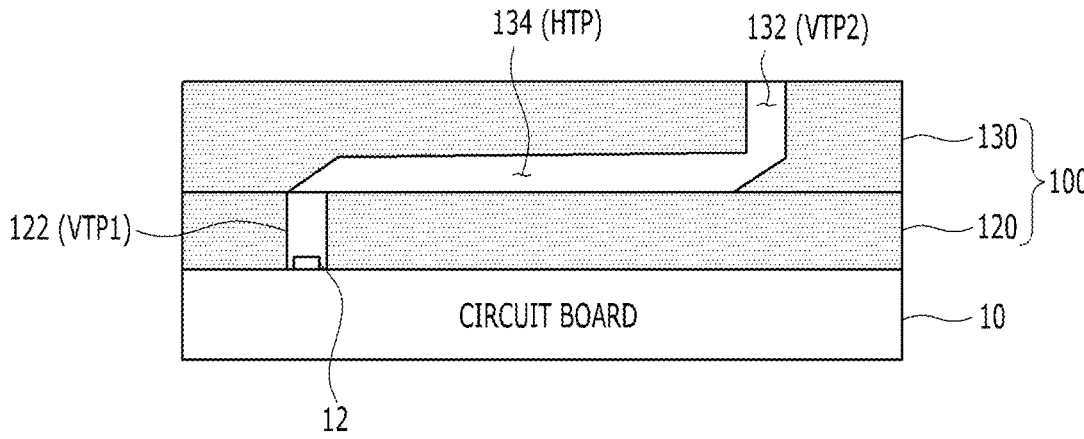
[FIG. 7]
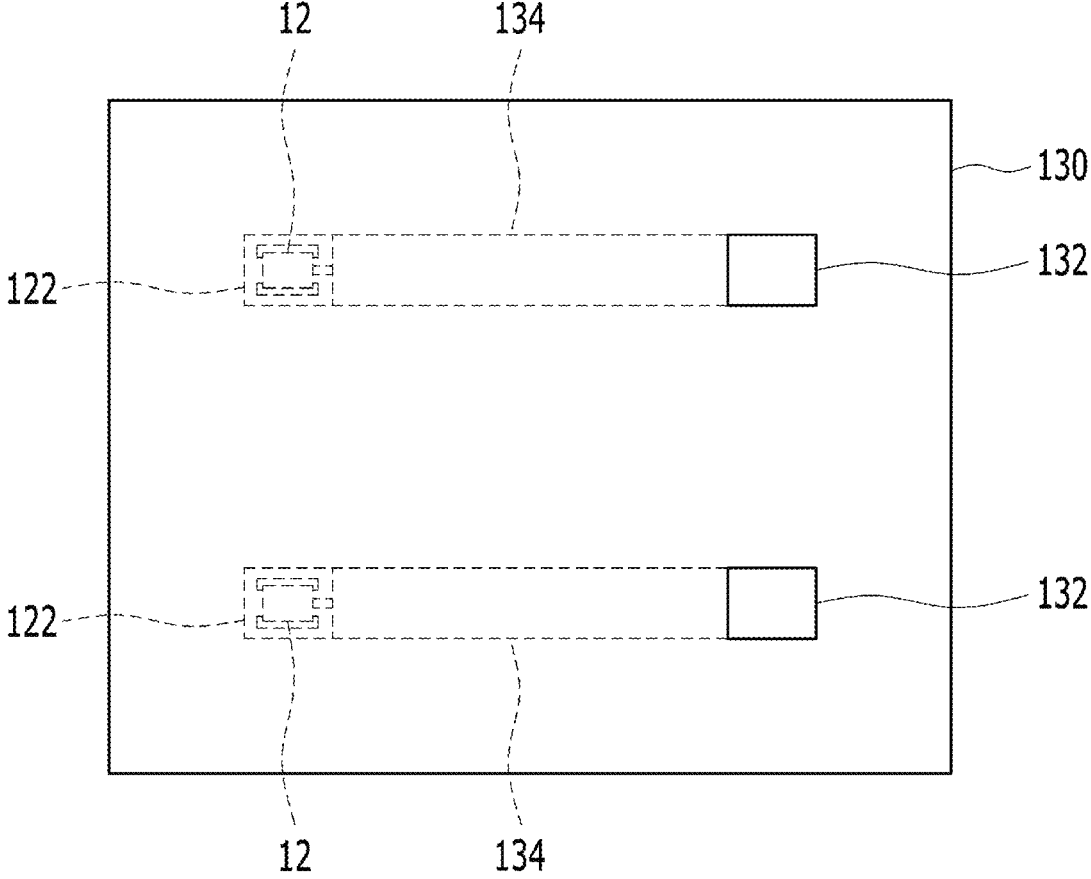

[FIG. 8]
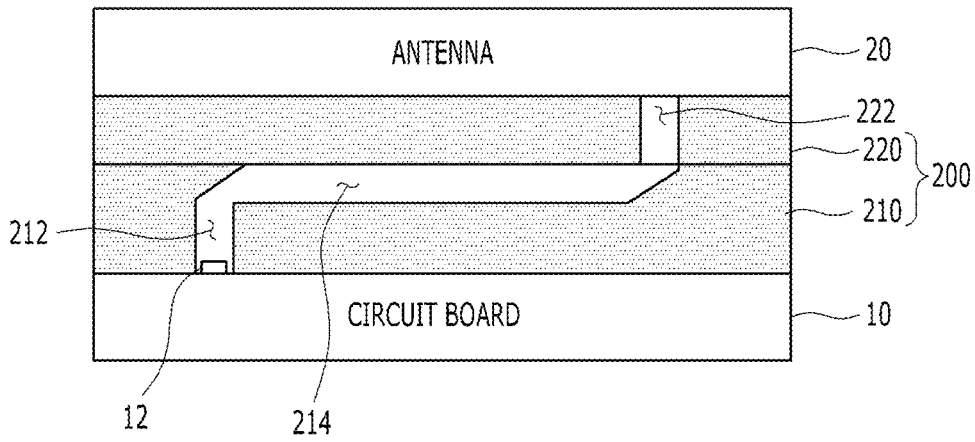
[FIG. 9]
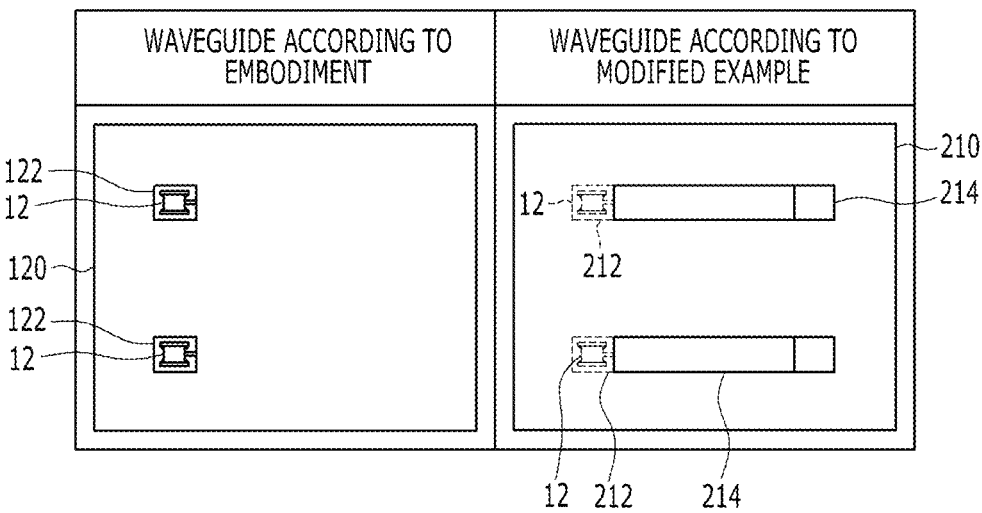

WAVEGUIDE COMPRISED OF STACKED LOWER AND UPPER PLATES, WHERE THE LOWER PLATE IS MOUNTED ON A CIRCUIT BOARD AND HAS A VIA THEREIN FOR ACCOMMODATING A LAUNCHER IN THE VIA

TECHNICAL FIELD

The present disclosure relates to a waveguide, and more specifically, to a waveguide for guiding the movement of radio waves.

BACKGROUND ART

Recently, research on a transmission and reception system using a high frequency of a millimeter wave band (76.5 GHz band) has been actively conducted. In the millimeter wave, an antenna having a waveguide structure is mainly used as an antenna for transmitting and receiving radio waves.

In this case, the waveguide is interposed between the antenna and a circuit board to minimize energy loss during the transmission of the radio waves. The waveguide is interposed between the circuit board on which a transmitter and a receiver are disposed and the antenna, transmits radio waves output from the transmitter to the antenna, and transmits the radio waves received by the antenna to the receiver.

In a transmission and reception system (hereinafter referred to as a "radar antenna system") operating at a high frequency of a millimeter wave band, antenna performance is sensitively changed when a tolerance occurs in an assembly process. That is, the radar antenna system has a problem that required antenna performance may not be accurately implemented when a tolerance occurs due to incorrect alignment of the antenna (3D radar), the waveguide, and the circuit board (2D printed circuit board (PCB)) in a manufacturing process.

SUMMARY OF THE INVENTION

Technical Problem

The present disclosure has been proposed to solve the problem of the related art and is directed to providing a waveguide having a first vertical transfer path formed at a lower plate coupled to a signal processing substrate and having a horizontal transfer path and a second vertical transfer formed at an upper plate coupled to a radar antenna, thereby minimizing a tolerance during assembly.

Solution to the Problem

In order to achieve the object, a waveguide according to an embodiment of the present disclosure includes a waveguide interposed between a circuit board and an antenna including a lower plate stacked on an upper surface of the circuit board and having a first vertical through-hole formed therein, and an upper plate stacked on an upper surface of the lower plate, having a second vertical through-hole formed at a position spaced apart from a region overlapping the first vertical through-hole, and having a horizontal groove connecting the first vertical through-hole and the second vertical through-hole.

The first vertical through-hole may be formed to vertically pass through the lower plate in a first region of the lower plate, and the first region may be a region overlapping a launcher of the circuit board when the lower plate is stacked on the circuit board.

The second vertical through-hole may be formed to vertically pass through the upper plate in a second region of the upper plate, and the second region may be a region spaced apart from a region overlapping the first vertical through-hole when the upper plate is stacked on the lower plate.

The horizontal groove may be formed in a lower surface of the upper plate in surface contact with the upper surface of the lower plate, and an inner wall surface of the horizontal groove and a lower surface of the lower plate may form a horizontal through-hole. A first end of the horizontal through-hole may be connected to the first vertical through-hole, and a second end of the horizontal through-hole may be connected to the second vertical through-hole to form a radio wave transfer path.

Advantageous Effects of the Invention

According to the present disclosure, the waveguide can have the vertical through-hole hole formed in the lower plate stacked on the upper surface of the circuit board, and thus the launcher of the circuit board may be exposed through the first vertical through-hole during a stacking process of the circuit board and the lower plate, thereby checking the degree of alignment of the lower plate and the circuit board.

In addition, the waveguide can align the circuit board and the lower plate through the position of the launcher exposed through the first vertical through-hole during the stacking process of the circuit board and the lower plate, thereby minimizing the tolerance occurring during the stacking process.

BRIEF DESCRIPTION OF THE DRAWINGS

FIG. 1 is a view for describing a transmission and reception system to which a waveguide according to an embodiment of the present disclosure is applied.

FIG. 2 is a view for describing the waveguide according to the embodiment of the present disclosure.

FIG. 3 is a view for describing a configuration of the waveguide according to the embodiment of the present disclosure.

FIGS. 4 and 5 are views for describing a lower plate of FIG. 3.

FIGS. 6 and 7 are views for describing an upper plate of FIG. 3.

FIG. 8 is a view for describing a waveguide of a modified example.

FIG. 9 is a view for describing a comparison between the waveguide according to the embodiment of the present disclosure and the waveguide of the modified example.

DETAILED DESCRIPTION OF THE EMBODIMENTS

Referring to FIGS. 1 and 2, a transmission and reception system to which a waveguide according to an embodiment of the present disclosure is applied includes a circuit board 10 and an antenna 20, and the waveguide 100 is interposed between the circuit board 10 and the antenna 20. The waveguide 100 is formed with a radio wave transfer path 110 (FIG. 2) between the circuit board 10 and the antenna 20. Here, although one radio wave transfer path 110 is shown in FIG. 2, the present disclosure is not limited thereto and two or more radio wave transfer paths 110 may be formed.

As an example, as shown in FIG. 2 the circuit board 10 includes a transmitter and a receiver, and the waveguide 100 may be formed with the radio wave transfer path 110 for transmitting radio waves between the transmitter of the circuit board 10 and the antenna 20 and the radio wave transfer path 110 for transmitting the radio waves between the receiver of the circuit board 10 and the antenna 20.

Referring to FIG. 2, the waveguide 100 transmits the radio waves between the circuit board 10 and the antenna 20 through the radio wave transfer path 110.

A launcher 12 is formed on the circuit board 10. A plurality of launchers 12 may be formed on the circuit board 10, and the launcher 12 may be divided into a transmission launcher and a reception launcher. Here, the circuit board 10 may include a plurality of transmission launchers and a plurality of reception launchers.

The transmission launcher is connected to the transmitter of the circuit board 10. The transmission launcher outputs radio waves generated by the transmitter (transmission circuit) of the circuit board 10 to the first radio wave transfer path 110 of the waveguide 100. That is, the radio wave output from the transmitter is transmitted to the transmission launcher, and the transmission launcher outputs the radio wave to the waveguide 100. The waveguide 100 transmits the radio wave output from the transmission launcher to the antenna 20 through the radio wave transfer path 110.

The reception launcher is connected to the receiver of the circuit board 10. The reception launcher transmits the radio wave received through the radio wave transfer path 110 of the waveguide 100 to the receiver (reception circuit) of the circuit board 10. That is, the radio waves received by the antenna 20 are transmitted to the waveguide 100 and transmitted to the reception launcher of the circuit board 10 through the radio wave transfer path 110 of the waveguide 100. The reception launcher transmits the radio wave received through the radio wave transfer path 110 to the receiver.

Referring to FIG. 3, the waveguide according to the embodiment of the present disclosure includes a lower plate 120 and an upper plate 130 and is interposed between an upper surface of the circuit board 10 and a lower surface of the antenna 20.

A transfer path TP is formed on the lower plate 120 and the upper plate 130, and the transfer path TP of the lower plate 120 and the transfer path TP of the upper plate 130 are connected to form the radio wave transfer path 110.

The lower plate 120 and the upper plate 130 are made of a resin material having a plated surface. In this case, the lower plate 120 and the upper plate 130 may also be made of a metal material.

Referring to FIG. 4, the lower plate 120 is stacked on the upper surface of the circuit board 10. The lower plate 120 is formed with one or more first vertical through-holes 122 forming the transfer path. The first vertical through-hole 122 vertically passes through the lower plate 120 to form a first vertical transfer path VTP1. A cross section of the first vertical through-hole 122 may be formed in various shapes such as a circle, an ellipse, and a quadrangle. An upper opening of the first vertical through-hole 122 is connected to a reception port or a transmission port formed on the lower surface of the antenna 20 (FIG. 3).

The lower plate 120 is stacked on the upper surface of the circuit board 10 and stacked so that the first vertical through-hole 122 overlaps a first region. As an example, the first region is a region including a region in which the launcher 12 of the circuit board 10 is formed among the entire upper surface of the circuit board 10.

In this case, the launcher 12 of the circuit board 10 is accommodated in the first vertical through-hole 122 as the lower plate 120 is stacked on the upper surface of the circuit board 10.

Referring to FIG. 5, as the lower plate 120 is stacked on the upper surface of the circuit board 10 shown in FIG. 4, the launcher 12 of the circuit board 10 shown in FIG. 4 may be exposed through the first vertical through-hole 122, and the launcher 12 of the circuit board 10 shown in FIG. 4 may be identified when viewed from an upper surface of the lower plate 120. Therefore, an operator can check a degree of alignment between the lower plate 120 and the circuit board 10 shown in FIG. 4, thereby minimizing a tolerance.

Referring to FIGS. 6 and 7, the upper plate 130 is stacked on the upper surface of the lower plate 120 as shown in FIG. 6. The upper plate 130 is formed with a second vertical through-hole 132 and a horizontal groove 134 forming the transfer path. Here, a plurality of second vertical through-holes 132 and a plurality of horizontal grooves 134 may be formed in the upper plate 130 as shown in FIG. 7.

The second vertical through-hole 132 vertically passes through the upper plate 130 to form a second vertical transfer path VTP2 as shown in FIG. 6. When the upper plate 130 is stacked, the second vertical through-hole 132 is formed in a second region spaced a predetermined interval from a region overlapping the first vertical through-hole 122 having the launcher 12 accommodated therein. A cross section of the second vertical through-hole 132 may be formed in various shapes such as a circle, an ellipse, and a quadrangle. In this case, the cross section of the second vertical through-hole 132 may be formed in the same shape as the cross section of the first vertical through-hole 122.

The horizontal groove 134 is formed in the lower surface of the upper plate 130. The horizontal groove 134 is formed in the lower surface of the upper plate 130 in surface contact with the upper surface of the lower plate 120. The horizontal groove 134 forms a horizontal transfer path HTP (FIG. 6) when the lower plate 120 and the upper plate 130 are coupled. That is, as the upper plate 130 is stacked on the lower plate 120, an inner wall surfaces of the horizontal groove 134 and the upper surface of the lower plate 120 form a horizontal through-hole, and the horizontal through-hole forms the horizontal transfer path HTP.

In this case, as the upper plate 130 is stacked on the lower plate 120, the horizontal transfer path HTP is connected to the first vertical transfer path VTP1 as shown in FIG. 6 and the second vertical transfer path VTP2 as shown in FIG. 6 to form the radio wave transfer path 110 (FIG. 3) of the waveguide 100 for transferring the radio waves between the circuit board 10 (FIG. 6) and the antenna 20 shown in FIG. 3. That is, a first end of the horizontal groove 134 is positioned to overlap the first vertical through-hole 122, and a second end of the horizontal groove 134 is positioned to overlap the second vertical through-hole 132. The horizontal groove 134 is connected to the upper opening of the first vertical through-hole 122 and a lower opening of the second vertical through-hole 132 to form the radio wave transfer path 110 (FIG. 3).

That is, a first end of the horizontal transfer path HTP formed by the horizontal groove 134 is connected to the first vertical transfer path VTP1 formed by the first vertical through-hole 122 as shown in FIG. 6, and the second end of the horizontal transfer path HTP is connected to the second vertical transfer path VTP2 formed by the second vertical through-hole 132 as shown in FIG. 6. Therefore, the radio wave transport path 110 having two refractions is formed in the waveguide as shown in FIG. 3.

Meanwhile, referring to FIG. 8, a waveguide 200 according to a modified example may also be composed of a lower plate 210 having a first vertical through-hole 212 and a horizontal groove 214 formed therein, and an upper plate 220 having a second vertical through-hole 222 formed therein.

As the upper plate 220 is stacked on an upper surface of the lower plate 210, the first vertical through-hole 212, the horizontal groove 214, and the second vertical through-hole 222 are connected to form the radio wave transfer path of the waveguide 200 between the circuit board and the antenna 20.

However, since the waveguide 200 has a horizontal groove 214 formed in the lower plate 210, the launcher 12 of the circuit board 10 is covered by the upper surface of the lower plate 210 in a state in which the lower plate 210 is mounted on the circuit board 10.

In this case, when using the waveguide 200, an operator may not check a degree of alignment between the lower plate 210 and the circuit board 10. Therefore, since it is difficult to accurately align the circuit board 10 and the lower plate 210, a tolerance inevitably occurs in a stacking process.

That is, referring to FIG. 9, since the waveguide 100 shown in FIG. 6 according to the embodiment of the present disclosure shown in the left side of FIG. 9 is formed by stacking the lower plate 120 formed with the first vertical through-hole 122 and the upper plate 130 shown in FIG. 6 is formed with the second vertical through-hole 132 and the horizontal groove 134 as shown in FIG. 6, it is possible to check the degree of alignment between the lower plate 120 and the launcher 12 of the circuit board in the stacking process, while since the waveguide 200 (see FIG. 8) according to the modified example shown in the right side of FIG. 9 is formed by stacking the lower plate 210 formed with the first vertical through-hole 212 and the horizontal groove 214 and the upper plate 220 shown in FIG. 8 is formed with the lower plate 210 and the second vertical through-hole 222 as shown in FIG. 8, it is not possible to check the degree of alignment between the lower plate 210 and the launcher 12 of the circuit board in the stacking process.

Therefore, it is preferable that the waveguide is formed by stacking the lower plate 120 having the first vertical through-hole 122 therein and the upper plate 130 having the second vertical through-hole 132 and the horizontal groove 134 formed therein as in the embodiment of the present disclosure as shown in FIG. 6.

Although the preferred embodiments according to the present disclosure have been described above, modifications can be made in various forms, and those skilled in the art can carry out various changes and modifications without departing from the scope of the claims of the present disclosure.

The invention claimed is:

1. A waveguide interposed between a circuit board and an antenna, comprising:

a lower plate stacked on an upper surface of the circuit board and having a first vertical through-hole formed therein; and an upper plate stacked on an upper surface of the lower plate, having a second vertical through-hole formed at a position spaced apart from a region overlapping the first vertical through-hole, and having a horizontal groove connecting the first vertical through-hole and the second vertical through-hole;

wherein the circuit board includes a launcher mounted on the upper surface of the circuit board and configured to transmit or receive radio waves, the first vertical through-hole is formed to vertically pass through a region of the lower plate that overlaps a first region of the upper surface of the circuit board where the launcher is located; and when the lower plate is stacked on the upper surface of the circuit board, the launcher is accommodated within the first vertical through-hole to be spaced apart from an inner wall of the first vertical through-hole and is exposed upward through the first vertical through-hole, wherein a height of the launcher is smaller than a depth of the first vertical through-hole so that an upper end of the launcher does not protrude beyond the upper surface of the lower plate.

2. The waveguide of claim 1, wherein the second vertical through-hole is formed to vertically pass through the upper plate in a second region of the upper plate that is spaced apart from the region of the upper plate overlapping the first vertical through-hole.

3. The waveguide of claim 1, wherein the horizontal groove is formed in a lower surface of the upper plate in surface contact with the upper surface of the lower plate.

4. The waveguide of claim 3, wherein, as the upper plate is stacked on the lower plate, inner wall surfaces of the horizontal groove and the upper surface of the lower plate form a horizontal through-hole.

5. The waveguide of claim 4, wherein a first end of the horizontal through-hole is connected to the first vertical through-hole, and a second end of the horizontal through-hole is connected to the second vertical through-hole to form a radio wave transfer path.

* * * * *